United States Patent
Imai et al.

(10) Patent No.: US 8,040,059 B2
(45) Date of Patent: Oct. 18, 2011

(54) DISPLAY DEVICE COMPRISING A CONDUCTIVE BARRIER BODY IN DIRECT CONTACT WITH A SEALING MATERIAL

(75) Inventors: Keitaro Imai, Kanagawa (JP); Aya Anzai, Kanagawa (JP); Yasuko Watanabe, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 904 days.

(21) Appl. No.: 10/569,528

(22) PCT Filed: Aug. 25, 2004

(86) PCT No.: PCT/JP2004/012599
§ 371 (c)(1),
(2), (4) Date: Feb. 23, 2006

(87) PCT Pub. No.: WO2005/022496
PCT Pub. Date: Mar. 10, 2005

(65) Prior Publication Data
US 2007/0046178 A1    Mar. 1, 2007

(30) Foreign Application Priority Data
Aug. 29, 2003    (JP) ................................ 2003-307267

(51) Int. Cl.
H01L 51/50    (2006.01)
H01L 51/52    (2006.01)
(52) U.S. Cl. ........................................ 313/512; 313/506
(58) Field of Classification Search ........................ None
See application file for complete search history.

(56) References Cited

U.S. PATENT DOCUMENTS

| 3,284,406 | A | * | 11/1966 | Nelson | 528/31 |
| 5,068,267 | A | * | 11/1991 | Uchida et al. | 523/435 |
| 6,391,771 | B1 | * | 5/2002 | Naik et al. | 438/653 |
| 6,466,279 | B1 | | 10/2002 | Nakata | 349/42 |

(Continued)

FOREIGN PATENT DOCUMENTS

EP    1 128 436 A1    8/2001

(Continued)

OTHER PUBLICATIONS

International Search Report re application No. PCT/JP2004/012599, dated Mar. 8, 2005.

(Continued)

Primary Examiner — Toan Ton
Assistant Examiner — Britt Hanley
(74) Attorney, Agent, or Firm — Husch Blackwell LLP

(57) ABSTRACT

It is an object of the present invention to provide a display device preventing the external invasion of water and/or oxygen and preventing the deterioration of a luminous element due to these invading substances and to provide a production method including simple production steps for producing the display device. The invention provides a display device having a sealing material on the rim of an exposed interlayer insulator for preventing the invasion of water and/or oxygen from the interlayer insulator. Further, the invention provides a display device having a barrier body on an exposed interlayer insulator for preventing the invasion of water and/or oxygen from the interlayer insulator. Furthermore, the application of droplet discharge technique in production steps for producing the display device can eliminate a photolithography step such as exposing and developing. Thus, a method of producing a display device having an improved yield is provided.

10 Claims, 12 Drawing Sheets

U.S. PATENT DOCUMENTS

| | | | |
|---|---|---|---|
| 6,714,183 B2 * | 3/2004 | Yamazaki et al. | 345/98 |
| 6,798,132 B2 * | 9/2004 | Satake | 313/495 |
| 6,833,560 B2 | 12/2004 | Konuma et al. | |
| 6,861,710 B2 | 3/2005 | Murakami et al. | 257/359 |
| 6,864,628 B2 | 3/2005 | Yamazaki et al. | 313/504 |
| 6,924,508 B2 | 8/2005 | Yoneda et al. | 257/72 |
| 6,992,439 B2 * | 1/2006 | Yamazaki et al. | 313/512 |
| 7,042,151 B2 | 5/2006 | Yamazaki et al. | 313/504 |
| 7,132,693 B2 | 11/2006 | Konuma et al. | |
| 7,732,824 B2 | 6/2010 | Konuma et al. | |
| 2001/0004190 A1 * | 6/2001 | Nishi et al. | 313/506 |
| 2002/0050786 A1 | 5/2002 | Yamazaki et al. | 313/504 |
| 2002/0158568 A1 * | 10/2002 | Satake | 313/493 |
| 2002/0180371 A1 | 12/2002 | Yamazaki et al. | 315/169.3 |
| 2002/0191124 A1 | 12/2002 | Nakata | 349/43 |
| 2003/0017360 A1 | 1/2003 | Tai et al. | 428/690 |
| 2003/0080338 A1 | 5/2003 | Yamazaki et al. | 257/59 |
| 2003/0127651 A1 | 7/2003 | Murakami et al. | 257/72 |
| 2004/0069987 A1 | 4/2004 | Yoneda et al. | 257/40 |
| 2005/0140280 A1 | 6/2005 | Yamazaki et al. | 313/504 |
| 2005/0156172 A1 | 7/2005 | Murakami et al. | 257/72 |
| 2010/0200871 A1 | 8/2010 | Konuma et al. | |

FOREIGN PATENT DOCUMENTS

| | | |
|---|---|---|
| EP | 1 376 713 A2 | 1/2004 |
| JP | 11-233257 | 8/1999 |
| JP | 11-307778 | 11/1999 |
| JP | 2000-133649 | 5/2000 |
| JP | 2001-312223 | 11/2001 |
| JP | 2002-151269 | 5/2002 |
| JP | 2002-324666 | 11/2002 |
| JP | 2003-324666 | 11/2002 |
| JP | 2003-197367 | 7/2003 |
| JP | 2003-203783 | 7/2003 |
| JP | 2003-208980 | 7/2003 |
| JP | 2003-233476 | 8/2003 |
| JP | 2003-243327 | 8/2003 |
| JP | 2004-063126 | 2/2004 |

OTHER PUBLICATIONS

Written Opinion re application No. PCT/JP2004/012599, dated Mar. 8, 2005.

Shimoda, T., "Ink-Jet Technology for Fabrication Processes of Flat Panel Displays," SID 03 Digest, pp. 1178-1181, May 21-22, (2003).

* cited by examiner

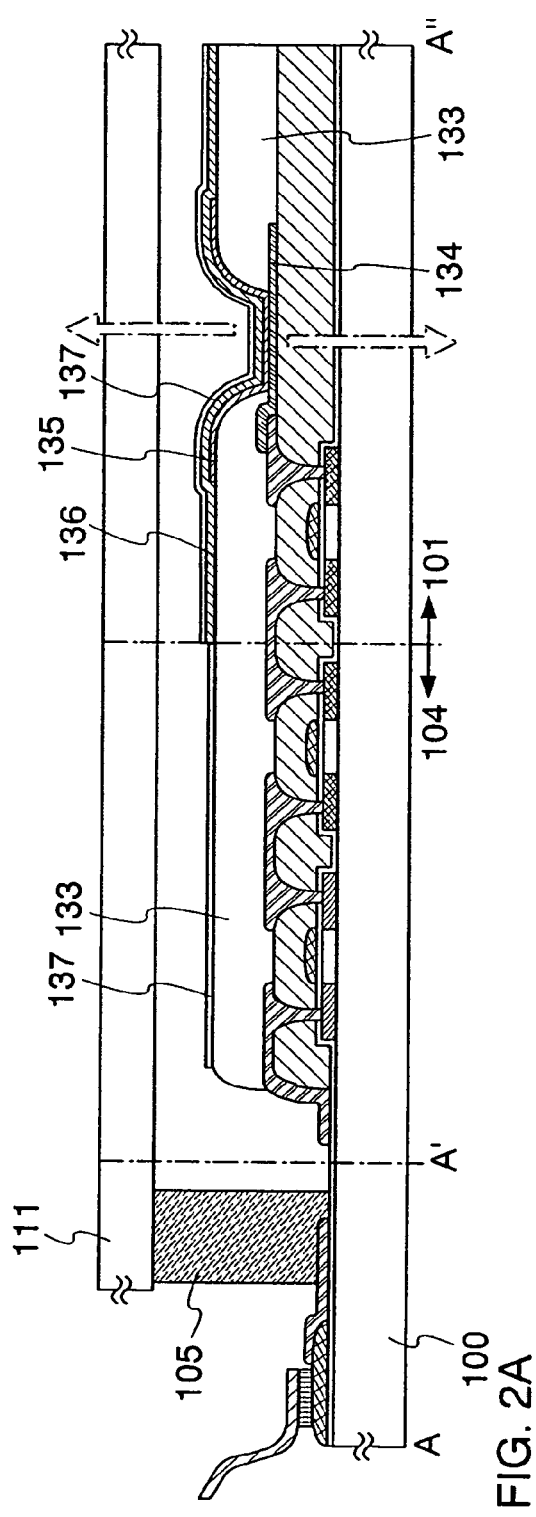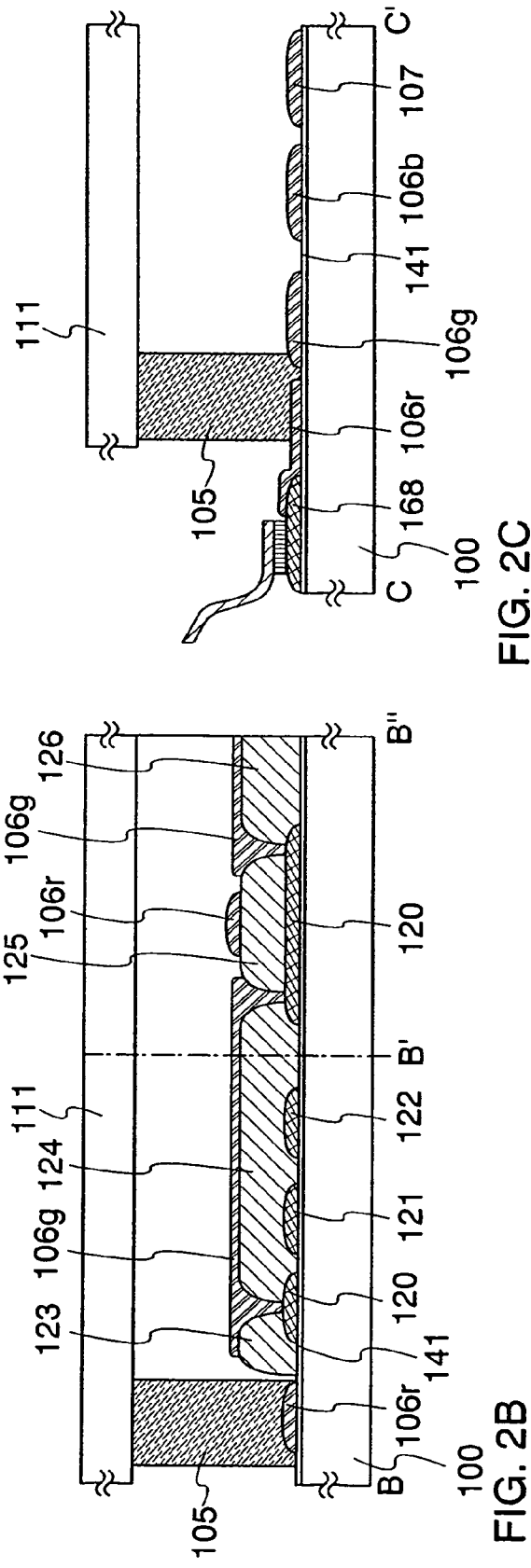

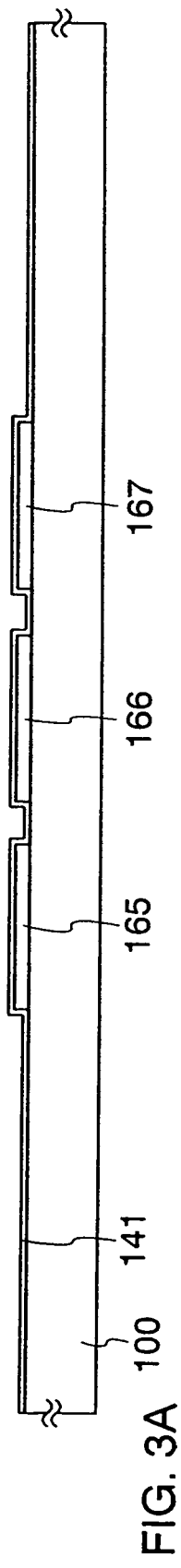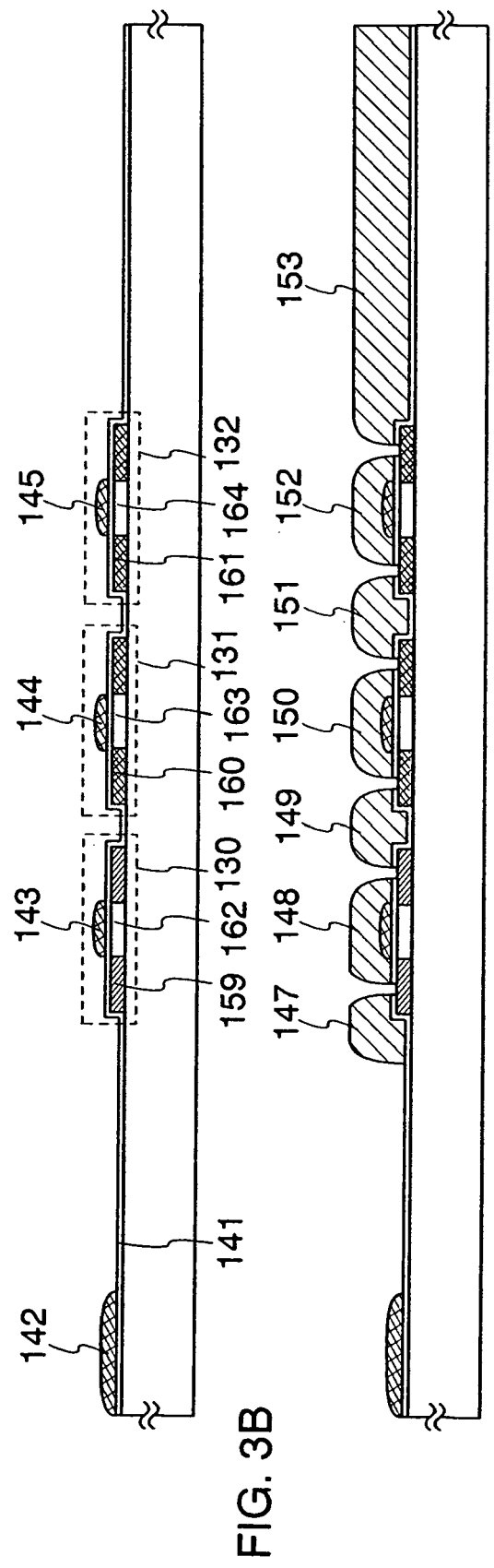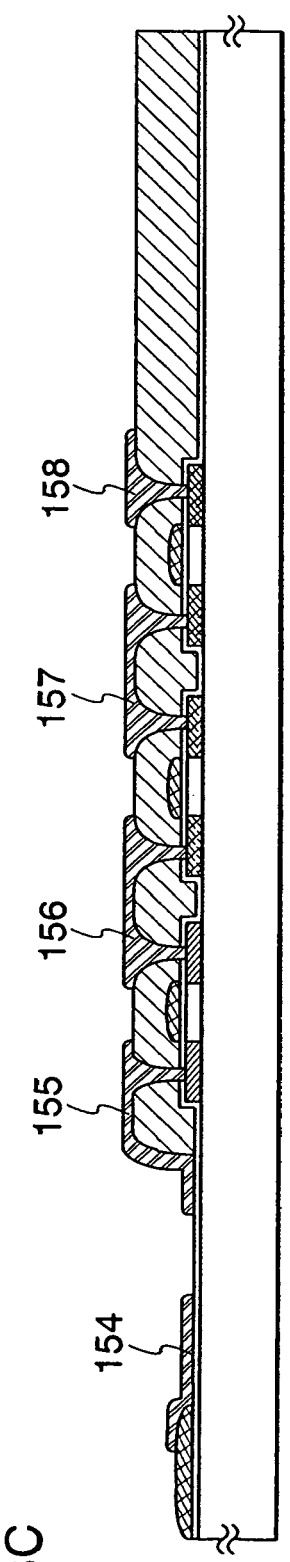

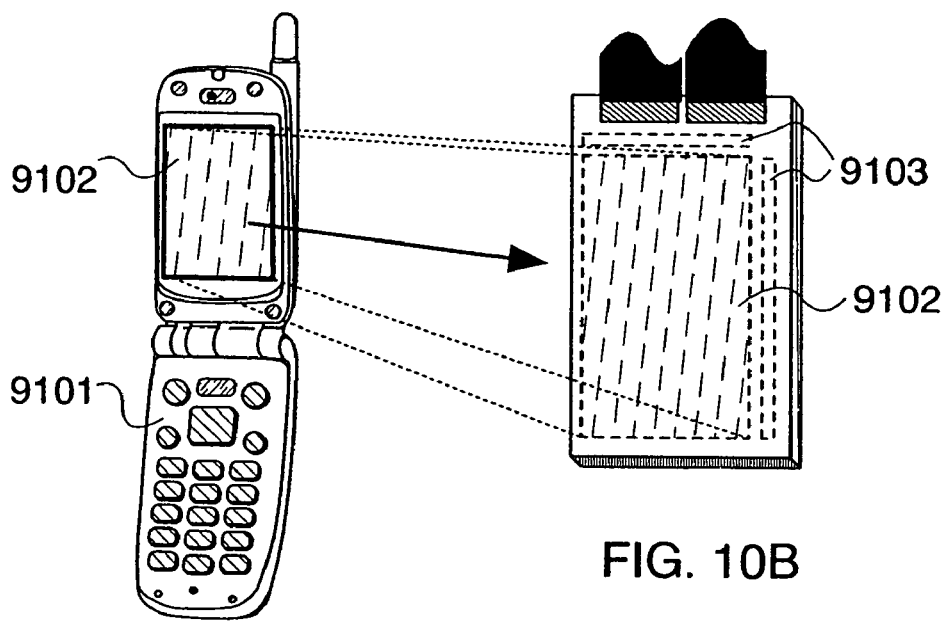
FIG. 10A
FIG. 10B
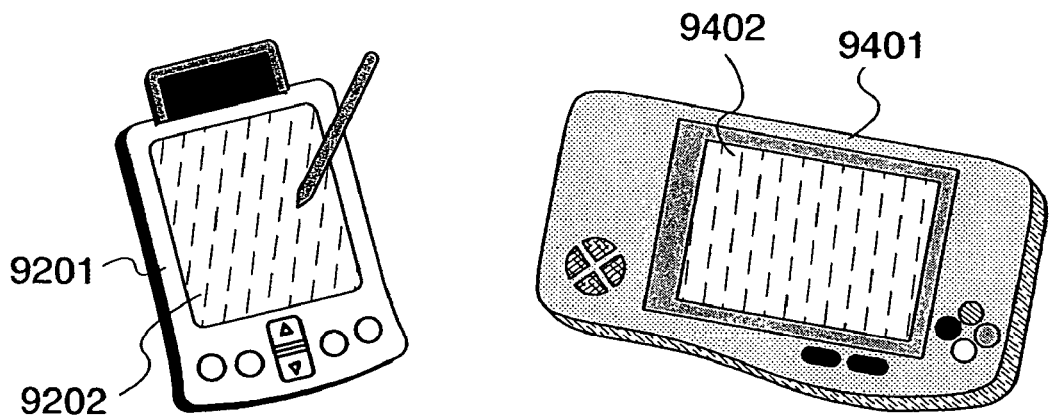
FIG. 10C
FIG. 10D
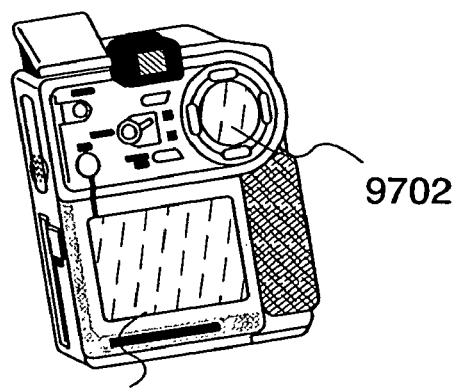
FIG. 10E

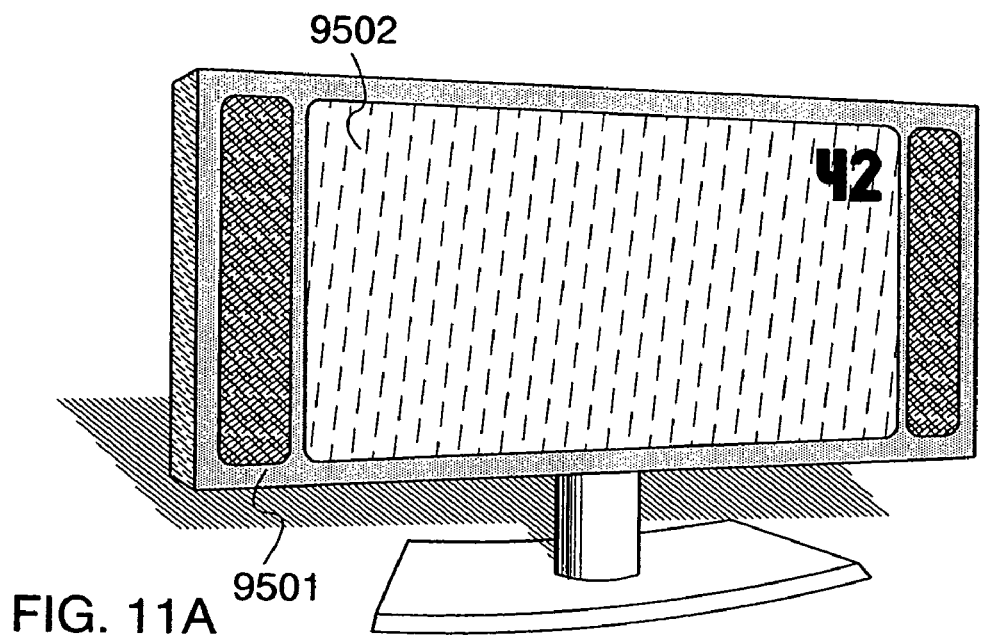
FIG. 11A
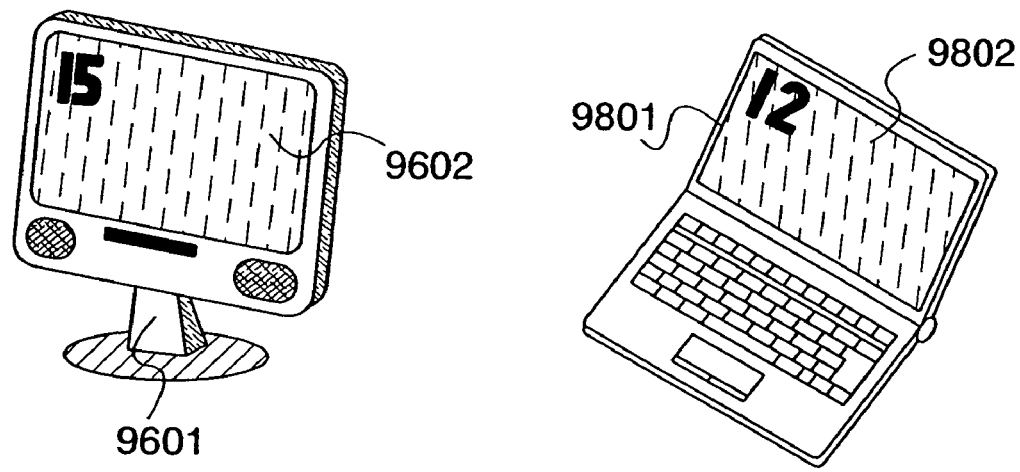
FIG. 11B
FIG. 11C

DISPLAY DEVICE COMPRISING A CONDUCTIVE BARRIER BODY IN DIRECT CONTACT WITH A SEALING MATERIAL

TECHNICAL FIELD

The present invention relates to a display device having a structure preventing the external invasion of water and/or oxygen and a method of producing the display device. In particular, the invention relates to a method of producing a display device by using droplet discharge technique.

BACKGROUND ART

In recent years, a display device including a self-luminous element such as an electroluminescence (EL) element has been developed. The display device is widely used by taking advantage of thinness, lightweight and so on due to the high quality, wide view angle and unnecessity of backlights because of the self-luminous characteristic.

However, in a self-luminous element, characteristics such as intensity may be deteriorated from the initial states, which may cause dark spots having partially low intensity and shrinks having intensities deteriorating from ends of display screens. These problems are due to deterioration of light emitters, which is caused by the invasion of water and/or oxygen to an exposed insulator and the extension of water and/or oxygen to the light emitters with the passage of time.

Furthermore, in recent years, the pattern forming by droplet discharge technique has been applied to the flat panel display field and has been actively developed. Droplet discharge technique has many advantages including unnecessity of a mask for direct rendering, easy application to a large substrate and a high use efficiency of materials. Thus, droplet discharge technique has been applied for producing an EL layer, a color filter, and electrodes for a plasma display (As disclosed in "T. Shimoda, Ink-jet Technology for Fabrication Processes of Flat Panel Displays, SID 03 DIGEST, pgs. 1178-1181").

DISCLOSURE OF INVENTION

The invention was made in view of these problems. Accordingly, it is an object of the invention to provide a display device preventing the external invasion of water and/or oxygen and preventing the deterioration of a luminous element due to these invading substances and to provide a production method including simple production steps for producing the display device.

In order to overcome the problems of the conventional technologies, following measures are instituted according to the invention.

According to one aspect of the invention, there is provided a display device having a sealing material on the rim of an exposed interlayer insulator for preventing the invasion of water and/or oxygen from the interlayer insulator.

The display device includes a display section having thin-film transistors and light emitters, a first substrate having a run wire on the rim of the display section, a second substrate opposed to the first substrate and a sealing material for pasting the first substrate and the second substrate. In this case, an interlayer insulator containing an organic material or a material having a skeletal structure including links between silicon and oxygen among multi-layer insulators on the first substrate is only provided at an internal part of the display section, and at an intersection of the run wire and wires, and the sealing material is provided on the rim of the interlayer insulator. The top and section views of the display device are shown in FIGS. 1A to 2B.

According to another aspect of the invention, there is provided a display device having a barrier body on an exposed interlayer insulator for preventing the invasion of water and/or oxygen from the interlayer insulator.

The display device includes a display section having thin-film transistors and light emitters, a first substrate having a drive circuit including the thin film transistors and a run wire on the rim of the display section, a second substrate opposed to the first substrate and a sealing material for pasting the first substrate and the second substrate. In this case, an interlayer insulator containing an organic material or a material having a skeletal structure including links between silicon and oxygen among multi-layer insulators on the first substrate is only provided at the internal part of the display section, and at an intersection of the run wire and wires. End portions of the interlayer insulator on the drive circuit are covered by the barrier body. The sealing material is provided on the drive circuit. The top and section views of the display device are shown in FIGS. 5 to 6B.

In the description of the display device of the invention, the term, "the rim of the display section", refers to an area excluding the display section on the first substrate. That is, the term, "rim", refers to a part externally surrounding something. The run wire collectively refers to a wire disposed on the rim of the display section. For example, four power supply lines including anode lines corresponding to red (R), green (G) and blue (B) and a cathode line and multiple wires connecting the display section, the drive circuit and so on to a connecting terminal are collectively called run wires.

Organic materials refer to acrylic, polyimide and/or the like. A material having a skeletal structure including links between silicon and oxygen refers to a compound material typically made by the polymerization of siloxane polymers. More specifically, the material refers to a material including a skeletal structure including links between silicon and oxygen and containing at least hydrogen in a substituent or a material having at least one of fluorine, alkyl groups and aromatic hydrocarbons in the substituent.

The interlayer insulator is a single-layer or multi-layer insulator on a gate insulating film included in a thin-film transistor. In many cases, the insulator has an opening, and a conductor filled in the opening functions as a wire connecting the upper layer pattern and the lower layer pattern. Therefore, the interlayer insulator corresponds to an insulator, which is thicker and, more specifically, is 50 nm to 5 µm (more preferably, 100 nm to 2 µm) thick. The ends of the interlayer insulator refer to the ends of the interlayer insulator pattern on the substrate.

The barrier body contains an insulating material or conductive material preventing the invasion of a substance facilitating the deterioration of light emitters. More specifically, the barrier body contains a resin containing monomers containing fluorine atoms in the molecules or a resin containing monomers including carbon and hydrogen atoms. Still more specifically, an epoxy resin, an acrylic resin, a phenol resin, a novolac resin, a meramine resin, an urethane resin and so on may be used.

The intersection of the run wires and wires refers to the intersection of the run wires, signal line and scan line arranged in the display section.

The drive circuit corresponds to a drive circuit on the substrate having the display section. For example, the drive circuit corresponds to a functional circuit corresponding to a signal line drive circuit, a scan line drive circuit, a CPU or a memory, for example. The display device includes a light source such as an image display device, a light-emitting device and an illumination apparatus. The invention includes a panel sealing a pixel section and the drive circuit between the substrate and the cover member, a module having an FPC on the panel, a module having a driver IC at the end of the FPC, a module having a driver IC implemented on the panel by COG method and a display to be used as a monitor.

According to another aspect of the invention, there is provided a method of producing a display device in which a thin film transistor, a light emitter and a run wire are formed on a first substrate, the method including the steps of discharging a composition containing a conductive material and forming a conductive pattern on the first substrate, forming at least one of multi-layer insulators on the first substrate only at an internal part of the display section, and at an intersection between the run wire and wires by using an organic material or a material having a skeletal structure including links between silicon and oxygen, forming a sealing material on the rim of the intersection among the internal part of the display section, the run wire and wires, and pasting an opposed second substrate to the first substrate through the sealing material. Through these steps, a display device is completed in which a sealing material is provided on the rim of an exposed interlayer insulator in order to prevent the invasion of water and/or oxygen from the interlayer insulator.

According to another aspect of the invention, there is provided a method of producing a display device, the method including the steps of discharging a composition containing a conductive material and forming a conductive pattern on the first substrate, forming at least one of multi-layer insulators on the first substrate only at an internal part of the display section, at an intersection between the run wire and wires by using an organic material or a material having a skeletal structure including links between silicon and oxygen, discharging a composition and forming a barrier body so as to be in contact with the insulator on the drive circuit, forming a sealing material on the drive circuit and pasting an opposed second substrate to the first substrate through the sealing material. Through these steps, a display device is completed in which a barrier body is provided on an exposed interlayer insulator in order to prevent the invasion of water and/or oxygen from the inter-layer insulator. Droplet discharge technique is applied for the step of discharging a composition containing a conductive material among these steps.

The invention having these constructions can prevent the invasion of water and/or oxygen to an insulator directly in contact with a light emitter and can prevent the deterioration of the light emitter. Therefore, the occurrence of dark spots and shrinks can be prevented, and a display device with improved reliability as a product can be provided.

Furthermore, the application of droplet discharge technique in production steps for producing the display device can eliminate a photolithography step such as exposing and developing. Thus, a method of producing a display device having an improved yield can be provided.

BRIEF DESCRIPTION OF DRAWINGS

FIG. 2A to 2C show a display device of the present invention (Embodiment Mode 1);

FIGS. 3A to 3D show a manufacturing method of a display device of the present invention (Embodiment Mode 1);

FIGS. 10A to 10E show electronic appliances applied to the present invention (Embodiment 2);

FIGS. 11A to 11C show electronic appliances applied to the present invention (Embodiment 2)

BEST MODE FOR CARRYING OUT THE INVENTION

Figure 1A:
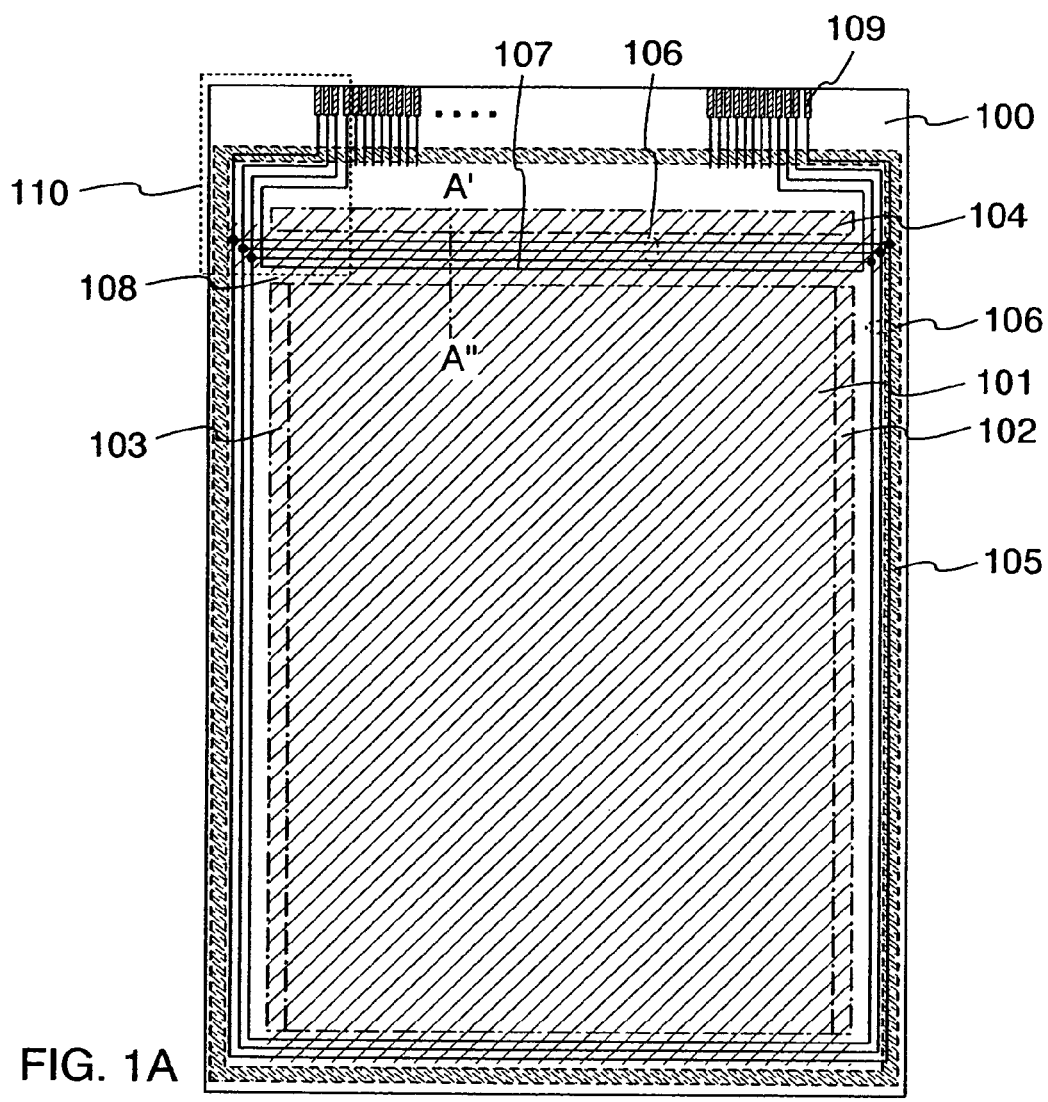
FIGS. 1A and 1B show a display device of the present invention (Embodiment Mode 1)

Embodiments of the invention will be described in detail with reference to drawings. However, it is easily understood by those skilled in the art that the invention is not limited by following descriptions and various changes may be made in forms and details without departing from the spirit and the scope of the invention. Therefore, the invention should not be limited by descriptions of embodiments below. The same reference numerals are commonly given to the same components in the construction of the invention, which will be described below.

Embodiment Mode 1

A display device of the invention will be described with reference to FIGS. 1A and 1B. FIG. 1A is a top view of the display device of the invention. The display device includes a display section 101, scan line drive circuits 102 and 103, a signal line drive circuit 104, a sealing material 105, run wires 106 and 107, an interlayer insulator 108 and a connecting terminal 109 on a substrate 100. In the display section 101, multiple pixels each including a light emitter and a thin film transistor are arranged in a matrix form.

The run wire 106 includes three power supply lines on the rim of the display section 101. The three power supply lines are anode lines corresponding to sub-pixels for red (R), green (G) and blue (B). One power supply line may be provided when power supply lines are not required for R, G and B, respectively, and supplying power supply potentials corresponding to the sub-pixels are not required for color image display. The run wire 107 is also a power supply line and is a cathode line herein.

The interlayer insulator 108 is an insulator among multiple insulators on the substrate 100. More specifically, the interlayer insulator 108 is a single-layer or multi-layer insulator on a gate insulating film included in a thin-film transistor. The interlayer insulator 108 corresponds to an insulator containing an organic material or a material having a skeletal structure including links between silicon and oxygen. In many cases, the interlayer insulator has an opening, and a conductor filled in the opening functions as a wire for connecting the upper layer pattern and the lower layer pattern. Therefore, the interlayer insulator 108 corresponds to an insulator, which is thicker and, more specifically, is 50 nm to 5 μm (more preferably, 100 nm to 2 μm) thick.

For example, the interlayer insulator 108 corresponds to an insulator insulating between a first conductor (gate electrode)

included in a top-gate thin film transistor and a second conductor (source-drain wire) connecting to an impurity region of a semiconductor (active layer) included in the thin film transistor. Furthermore, the interlayer insulator 108 corresponds to an insulator disposed between a semiconductor (active layer) included in a bottom-gate thin film transistor and the conductor (source-drain wire) connecting to the impurity region of the semiconductor. Still further, the interlayer insulator 108 corresponds to an insulator disposed between a first conductor connecting to an N-type amorphous semiconductor included in a channel-protected and channel-etched thin film transistor and a second conductor connecting to the first conductor.

The connecting terminal 109 is a terminal to which an FPC, for example, is pasted through conductive particles. Various signals and power voltage are supplied to the display section 101 through the connecting terminal 109.

Figure 1B:
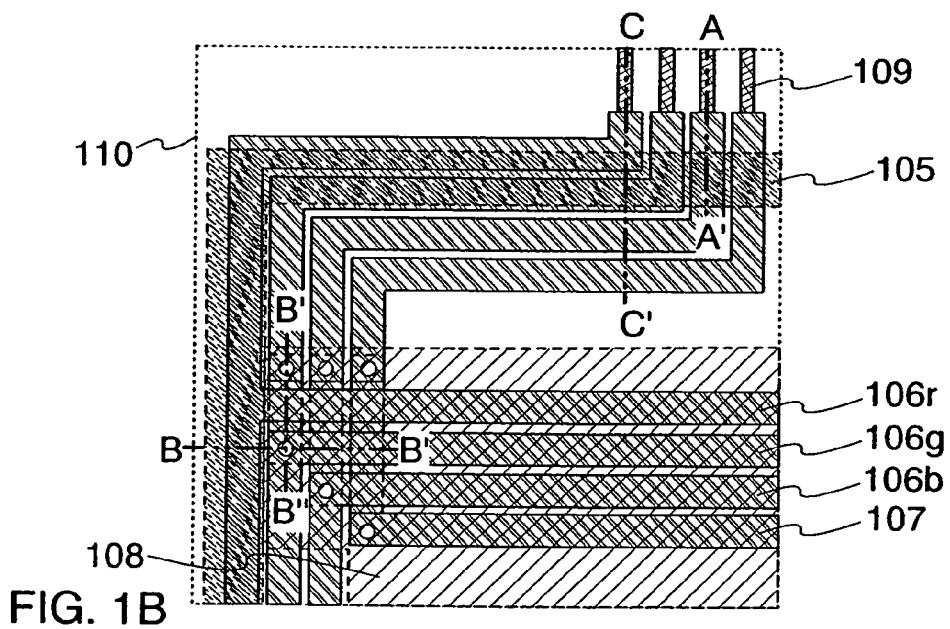

While FIGS. 1A and 1B show the display device integrally including the display section 101, scan line drive circuits 102 and 103 and signal line drive circuit 104 on the substrate 100, the display device may integrally include the scan line drive circuits 102 and 103 only as required for some applications of the display device. In this case, as the signal line drive circuit 104, a driver IC may be implemented by COG method. Alternatively, all drive circuits may be replaced by driver ICs.

FIG. 1B is an enlarged diagram of the area 110 surrounded by the dashed line in FIG. 1A. The enlarged area 110 includes the sealing material 105, the run wires 106 and 107 and the interlayer insulator 108. As described above, the run wires 106 include three anode lines. FIG. 1B includes an anode line 106*r* corresponding to R, an anode line 106*g* corresponding to G, and an anode line 106*b* corresponding to B.

The display device of the invention is characterized by positions of the sealing material 105 and the interlayer insulator 108. More specifically, the display device of the invention is characterized in that the interlayer insulator 108 is only provided within the display section 101 and at intersections of the run wires 106 and 107 and wires, and that the sealing material 105 is provided on the rim of the interlayer insulator 108.

The intersections of the run wires 106 and 107 and wires include intersections of signal lines within the display section 101 and the run wires 106 and 107 and intersections of the run wires 106.

The invention having these features can prevent the invasion of water and/or oxygen to an insulator directly in contact with light emitters and can prevent the deterioration of the light emitters since the sealing material 105 is provided on the rim of the interlayer insulator 108. Therefore, the occurrence of dark spots and shrinks can be prevented, and a display device with improved reliability as a product can be provided.

FIG. 2B is a section diagram taken at the lines B-B'-B" in FIG. 1A and is a section diagram of the run wires. In FIG. 2B, an insulator 141 is provided on the substrate 100. The insulator 141 is a gate insulating film. First conductors 120 to 122, interlayer insulator 123 to 126, the second conductors 106*r*, 106*g* and 106*b* corresponding to anode lines are provided on the insulator 141. The substrate 100 is pasted to the substrate 111 through the sealing material 105. FIG. 2C is a section diagram taken at the line C-C' in FIG. 1B and is a section diagram of run wires. In FIG. 2C, an insulator 141 is provided on the substrate 100. The insulator 141 is a gate insulating film. A first conductor 168 and the second conductors 106*r*, 106*g* and 106*b* are provided on the insulator 141. The first conductor 168 functions as the connecting terminal 109. The second conductors 106*r*, 106*g* and 106*b* correspond to anode lines. The substrate 100 is pasted to the substrate 111 through the sealing material 105.

As shown in FIG. 2B, the interlayer insulators 123 to 126 are provided at the intersection of the run wires 106. On the other hand, as shown in FIG. 2C, the interlayer insulators 123 to 126 are only provided at the display section 101, and at the intersections the run wires and wires.

FIG. 2A is a section diagram taken at the line A-A'-A" in FIGS. 1A and 1B and is a section diagram of the display section 101, the signal line drive circuit 104 and the connecting section 109. The sectional structure in FIG. 2A will be described below with reference to FIGS. 3A to 3D in accordance with production steps.

The substrate 100 may be a glass substrate, a quartz substrate, a metal substrate, a bulk semiconductor substrate, a stainless substrate or a plastic substrate with resistance to processing temperatures of production steps (FIG. 3A). A base film containing an insulator is formed on the substrate 100 as required. Next, semiconductors 165 to 167 are formed on the substrate 100 by a publicly known method (such as sputtering, LPCVD and plasma CVD). Here, the semiconductors 165 to 167 are polycrystalline semiconductors. The polycrystalline semiconductors are formed by forming an amorphous semiconductor by a publicly-known method, crystallizing the amorphous semiconductor by a publicly known crystallizing method (laser-crystallizing, thermal crystallizing by RTA, or with furnace annealing or thermal crystallizing using metal elements facilitating crystallization) and patterning the result in a desired form.

Next, the insulator 141 containing a silicon oxide film and/or a silicon nitride film is formed on the semiconductors 165 to 167 by a publicly known method. The insulator 141 functions as a gate insulating film.

Next, the first conductors 142 to 145 are formed on the insulator 141 by discharging a composition containing a conductive material by droplet discharge technique (FIG. 3B). The first conductors 142 to 145 function as connecting terminals or gate electrodes.

A pattern in droplet discharge technique may be produced by a droplet discharge unit. The droplet discharging unit includes a unit for discharging droplets such as a nozzle having an outlet of compositions, and a head having one or more nozzles. The diameter of the nozzle of the droplet discharging unit may be defined at 0.02 to 100 μm (more preferably, 30 μm or smaller), and a discharged amount of a composition to be discharged from the nozzle may be defined at 0.001 pl to 100 pl (more preferably, 10 pl or smaller). The discharged amount increases in proportion to the size of diameter of the nozzle. However, the diameter of the nozzle may be changed in accordance with a form and/or size of the first conductors 142 to 145. In order to drop to a desired position, a distance between a subject and the outlet of the nozzle is preferably short as much as possible and, more preferably, is defined at 0.1 to 3 mm (more preferably, 1 mm or smaller).

A composition to be discharged from the outlet may be one resulting from melting or dispersing a conductor to a solvent. The conductor may correspond to metal such as silver (Ag), gold (Au), copper (Cu), nickel (Ni), platinum (Pt), paradium (Pd), iridium (Ir), rhodium (Rh), tungsten (W) and aluminum (Al) or silver halide fine grains or dispersed nano particles. Alternatively, the conductor may correspond to indium tin oxide (ITO), organic indium, organic tin, zinc oxide (ZnO), and/or titan nitride (TiN) to be used for a transparent conductive film. However, a composition to be discharged from the outlet is preferably one resulting from melting or dispersing a material of gold, silver or copper to a solvent in consideration of a resistivity value. More preferably, the conductor is a low resistant silver or copper. However, when silver or copper is used, a barrier film may be used in addition as an impurity measure.

The solvent may correspond to ester such as butyl acetate and ethyl acetate, alcohol such as isopropyl alcohol and ethyl alcohol or an organic solvent such as methylethylketone and acetone.

The viscosity of the composition is preferably 50 cp or smaller in order to prevent drying or to smoothly discharge the composition from the outlet. The surface tension of the composition is preferably 40 mN/m or smaller. In accordance with a solvent to be used or an application, the viscosity of the composition may be adjusted as required. For example, the viscosity of the composition resulting from melting or dispersing ITO, organic indium or organic tin to a solvent may be 5 to 50 mPa·S. The viscosity of the composition resulting from melting or dispersing silver to a solvent is 5 to 20 mPa·S. The viscosity of the composition resulting from melting or dispersing gold to a solvent is 10 to 20 mPa·S.

The diameter of particles of the conductor is preferably small as much as possible in order to prevent clogging of the nozzle and/or to produce a high definition pattern though the diameter of particles depends on the diameter of the nozzle. The diameter of particles is preferably 0.1 µm or smaller. The composition may be formed by a publicly-known method such as electrolysis, atomizing or wet reducing. The particle size is generally about 0.5 to 10 µm. However, when the nozzle is formed by gas-evaporation technique, a nano molecular protected by a dispersion is about 7 nm, which is minute. When the surfaces of the nano particles are covered by a coating, the nano particles are not coagulated in the solvent. The nano particles are dispersed in a stable manner at a room temperature. That is, the nano particles exhibit substantially the same behavior as that of liquid. Therefore, a coating is preferably used.

When the composition is discharged under a reduced pressure, the solvent of the composition is volatilized before the discharged composition hits a subject. Thus, later steps of drying and firing can be omitted. Discharging the composition is preferably performed under a reduced pressure since an oxidized film is not formed on the surface of the conductor, for example.

After the composition is discharged, one or both of steps of drying and firing is/are performed. While both of the steps of drying and firing are heating steps, the drying step is performed at 100 degrees for three minutes and the firing step is performed at 200 to 350 degrees for 15 to 30 minutes. The objects, temperatures and times thereof are different. The drying step and the firing step are performed under a normal pressure or a reduced pressure by laser-light irradiation, rapid thermal annealing or furnace annealing. The heating processing may be performed after the first conductors 142 to 145 are formed or an insulator is formed on the first conductors 142 to 145. The timing of the heating processing is not especially limited. In order to perform the drying and firing steps well, the substrate may be heated in advance. The temperature depends on a material of the substrate, for example, but is generally 100 to 800 degrees (preferably 200 to 350 degrees). These steps can volatize a solvent in the composition or chemically remove a dispersion. Furthermore, the surrounding resin hardens and shrinks, which brings nano particles into contact with each other. Thus, the mixture and fusion are accelerated.

The laser-light irradiation may use continuously oscillated or pulse-oscillated gas laser or solid laser. The former gas laser may be excimer laser or YAG laser. The latter solid laser may be laser containing crystal such as YAG and $YVO_4$ containing Cr, Nd and so on. In consideration of an absorption coefficient of laser light, continuously oscillated laser is preferably used. So-called hybrid laser irradiation may be adopted in which pulse oscillation and continuous oscillation are combined. However, in accordance with heat resistance of the substrate 100, the heating processing through laser light irradiation may be performed rapidly for several micro seconds to about 30 seconds so as not to destroy the substrate 100.

Rapid thermal annealing (RTA) is performed by increasing a temperature rapidly and heating rapidly for several minutes to several micro seconds in an atmosphere with inactive gas by using an infrared lamp or halogen lamp for irradiating ultraviolet ray or infrared ray. The rapid processing can only essentially heat a thin film on the uppermost surface, which does not affect the lower films. In other words, the substrate 100 having lower thermal resistance, such as a plastic substrate, is not affected.

Next, by using, as a mask, one or both of the produced first conductors 142 to 145 and a resist produced as required, a P-type or N-type giving impurity is added to the semiconductor 165 to 167, and the impurity regions 159 to 161 containing an impurity and the channel-forming region 162 to 164 are formed.

Thus, transistors (thin film transistors, TFFs) 130 to 132 are completed including the semiconductors 165 to 167 including any one of the impurity regions 159 to 161 and any one of the channel-forming regions 162 to 164, the insulator 141 and the first conductors 143 to 145.

Next, interlayer insulators 147 to 153 (FIG. 3C) are formed on the insulator 141 by forming an insulator 50 nm to 5 µm thick (more preferably 100 nm to 2 µm) all over the insulator 141 by a publicly known method such as plasma CVD, sputtering, SOG (Spin On Glass) and spin coating and patterning the insulator into a desired form through a mask.

The interlayer insulators 147 to 153 are preferably formed by droplet discharge technique. This is because the use efficiency of a material is more significantly increased than that of a publicly known method (especially, spin-coating). Furthermore, when a composition is discharged only to a desired position by droplet discharge technique, the steps of exposing and developing can be omitted. Thus, the yield can be significantly increased. However, in this case, before a source-drain wire is formed, the insulator 141 functioning as a gate insulating film must be patterned.

Each of the interlayer insulators 147 to 153 is preferably a single layer or multi-layer of a material containing silicon such as a silicon oxide film, a silicon nitride film, silicon nitride oxide film and silicon oxide nitride film, an organic material such as acrylic, benzocyclobutene, parylene, flair and transparent polyimide, and/or a compound material made by the polymerization of siloxane polymers. The interlayer insulators 147 to 153 containing an organic material are highly flat, which can prevent the extreme reduction in thickness and/or the occurrence of a break at any level changes even though a conductor is formed thereon later. However, in order to prevent the occurrence of degassing from an organic material, thin films containing an inorganic material containing silicon may be formed as the lower and upper layers of the interlayer insulators 147 to 153. More specifically, a silicon nitride oxide film or a silicon nitride film is preferably formed by plasma CVD or sputtering.

According to the invention having this construction, the deterioration of light emitters can be prevented since an organic material as an insulator between layers is externally shielded, which can prevent the water absorption. An organic material absorbs water but is highly flat, which is highly advantageous to be used as a thin film or bank between layers. In other words, according to the invention, an organic material can be used in a place requiring flatness without caring the water absorption of the organic material. An organic material has advantageously a low dielectric constant and can be used as a thin film between layers to reduce wire capacities. Thus, an organic material is preferably used in a display device requiring rapid operations. A siloxane polymer is a typical example of a material including a skeletal structure including links between silicon and oxygen and containing at least hydrogen in a substituent or a material having at least one of fluorine, alkyl groups and aromatic hydrocarbons in the substituent. However, various materials under the conditions can be used instead. A siloxane polymer exhibits high flatness and also has transparency and thermal resistance. Thus, heating processing at a temperature of 300 degrees to 600 degrees or lower can be performed after an insulator containing siloxane polymers is formed. The heating processing allows both of the hydrogenation process and the firing process to be performed at the same time.

Next, second conductors 154 to 158 are formed on the insulator 141 and the interlayer insulators 147 to 153 by discharging a composition including a conductive material by droplet discharge technique. In this case, the second conductors 154 to 158 function as run wires or source wires and drain wires.

Next, a conductor 134 is formed so as to be in contact with the conductor 158 in contact with the impurity region 161 included in the transistor 132 by droplet discharge technique (FIG. 2A). In this case, the conductor 134 functions as a first electrode (pixel electrode). Next, an insulator 133 functioning as a bank is formed by a publicly known method, and an electric field light-emitting layer 135 is formed in contact with the conductor 134. Then, a conductor 136 is stacked in contact with the electric field light emitting layer 135. Thus, a light emitter is completed including the conductor 134, the electric field light emitting layer 135 and the conductor 136.

A pair of electrodes in the light emitter corresponds to an anode and a cathode. The anode and cathode preferably contain a material such as metal, an alloy, an electric conductor compound or the mixture thereof. While the anode contains a material having a large work function, the cathode contains a material having a small work function. The electric field light emitting layer between the anode and the cathode has a single layer, a multi-layer or a mixture structure broadly containing an organic material (low polymers, high polymers and/or conjugated polymers) and/or an inorganic material. Luminescence in the electric field light emitting layer includes light (fluorescence) to be emitted in returning from a singlet exciting state to a basal state and light (phosphorus light) to be emitted in returning from a triplet exciting state to a basal state. A material contained in the electric field light emitting layer may be a singlet material or a triplet material. Refer to Japanese Patent Application Laid-open No. 2002-151269 for these materials and the structures.

Light may be emitted from the light emitter either toward the substrate 100 (lower side emission) or in the opposite direction of the substrate 100 (upper side emission). Furthermore, the pair of electrodes of the light emitter may contain a transparent material or may have a thickness allowing light to pass through so as to perform double-side light emission including upper-side emission and lower-side emission.

Finally, an insulator 137 is formed on the entire surface. In this case, the insulator 137 functions as a protective film. An insulator 133 functioning as a bank is formed by a material containing silicon and/or an organic material by a publicly known method. However, the electric field light emitting layer 135 is thin and may be easily broken at a level change. Thus, the electric field light emitting layer 135 may be formed by light-sensitive acrylic and/or light-sensitive polyimide from which a gentle surface having serially changing radiuses of curvature can be obtained.

Subsequently, a sealing material 105 is formed on the rim of the interlayer insulators 147 to 153 by screen printing or dispenser method, and the substrate 100 and the substrate 111 are pasted through the sealing material 105. Through these steps, a display device having light emitters is completed.

According to the invention having the production method, all conductive patterns of the first conductors 142 to 145, the second conductors 154 to 158 and the conductors 134 and 136 are formed by droplet discharge technique.

Therefore, these features can provide following advantages. First of all, a thin film entirely containing a conductive material is formed, and pattern processing is performed thereon. Thus, wires may be shorted due to the conductive material remaining in the side or end of a contact hole (opening). The invention using droplet discharge technique can prevent the occurrence of the short. Furthermore, the invention using droplet discharge technique can significantly improve the use efficiency of materials and reduce a processing amount of liquid wastes. Thus, processes contributing to the resolution of environmental issues can be provided. Still further, the production steps can be simplified since a mask is not required, which can improve the yield. The invention is easily applicable to a fifth or higher generation substrate having one meter or larger side. Thus, even under a normal pressure, a vacuum mechanism, for example, is not required. Therefore, an increase in footprint within a clean room can be suppressed.

The section structure shown in FIG. 2 includes the conductor 134 on the same layer as the layer having the second conductors 155 to 158. In this case, the conductor 134 functions as a pixel electrode. However, in order to improve an aperture ratio for emitting light from the light emitters in the opposite direction of the substrate 100, that is, for so-called upper side emission, another insulator layer may be additionally formed on the second conductors 155 to 158. Then, a conductor functioning as a pixel electrode may be formed on the insulator. The section structure in that case is shown in FIG. 4.

Figure 4:
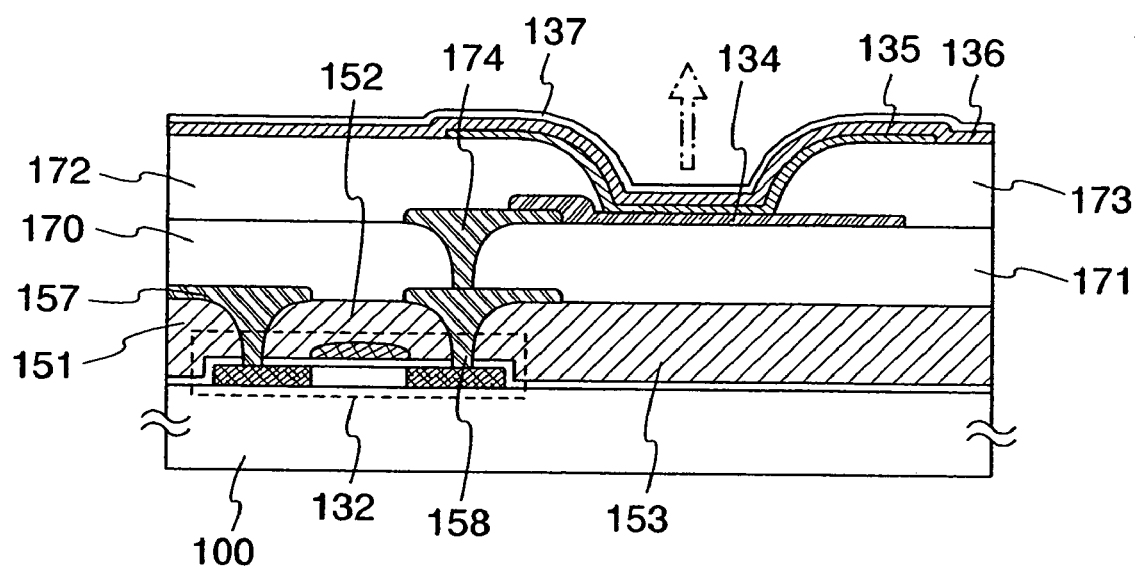
FIG. 4 shows a display device of the present invention (Embodiment Mode 1)

In FIG. 4, the transistor 132 is provided on the substrate 100. The interlayer insulators 151 to 153 and the second conductors 157 and 158 in contact with the interlayer insulators 151 to 153 are provided on the transistor 132. The interlayer insulators 170 and 171, and the third conductor 174 in contact with the interlayer insulators 170 and 171 are provided on the second conductor 158. A light emitter including the conductor (pixel electrode) 134 in contact with the third conductor 174, the electric field light emitting layer 135 and the conductor (opposed electrode) 136 is provided on the insulators 172 and 173. Then, the insulator 137 covers thereover entirely.

One or both of the interlayer insulators 151 to 153 and the interlayer insulators 170 and 171 is/are formed by an organic material and/or an inorganic material containing silicon by a publicly known method. However, when an organic material is used, a thin film containing a material containing silicon may be formed above and/or below a thin film containing the organic material in order to prevent the occurrence of degassing.

A display device having the structure shown in FIG. 4 allows an increase in wiring area of the conductor 134 functioning as a pixel electrode. Thus, the aperture ratio can be improved.

Embodiment Mode 2

Figure 5:
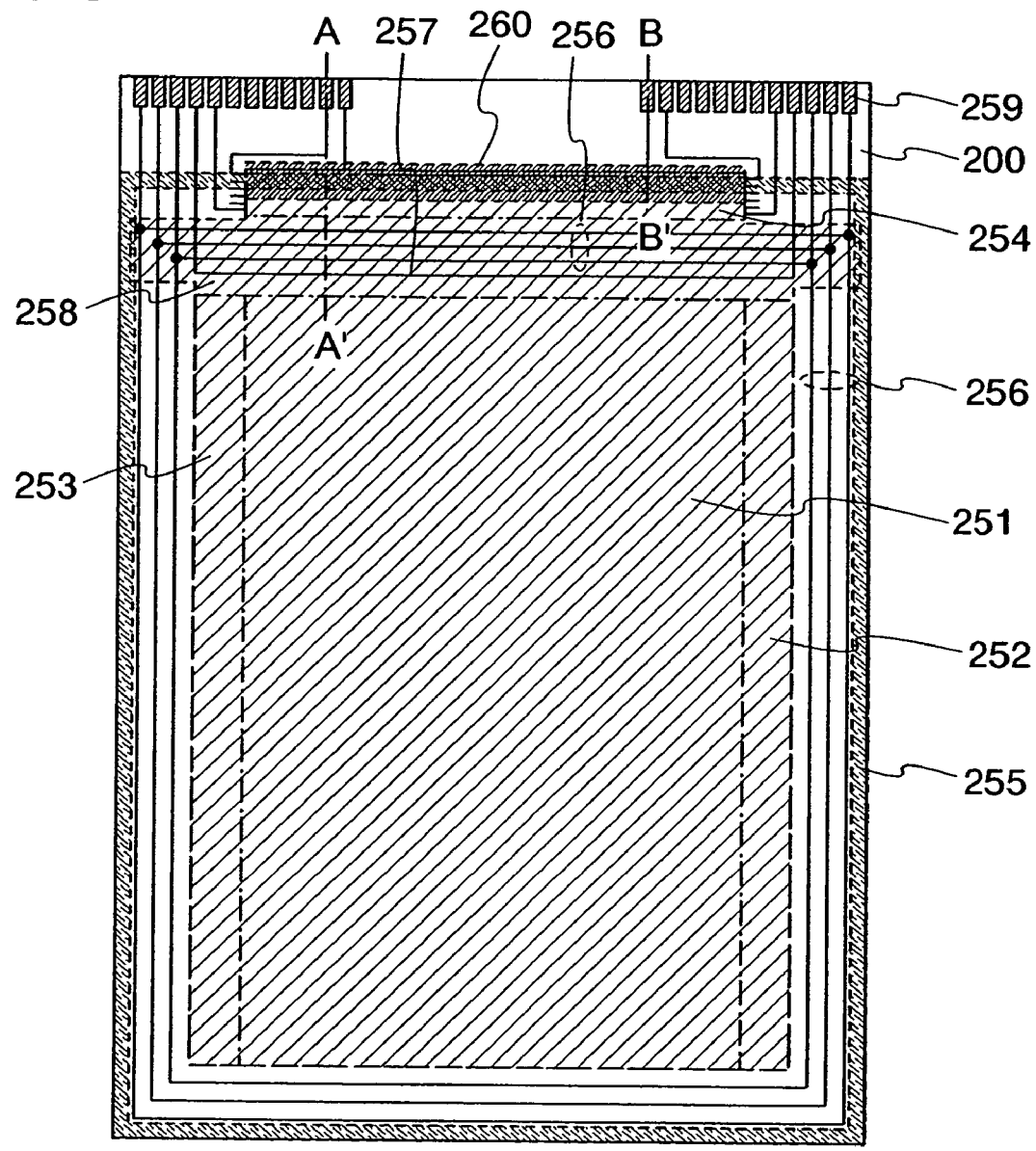
FIG. 5 shows a display device of the present invention (Embodiment Mode 2)

A display device of the invention will be described with reference to FIGS. 5 and 12. FIG. 5 is a top view of the display device of the invention. The display device includes a display section 251, scan line drive circuits 252 and 253, a signal line drive circuit 254, a sealing material 255, run wires 256 and 257, an interlayer insulator 258, a connecting terminal 259 and a barrier body 260 on a substrate 200. In the display section 251, multiple pixels each including a light emitter are arranged in a matrix form.

The run wire 256 includes three power supply lines on the rim of the display section 251. The run wire 257 is also a power supply line and is a cathode line herein.

The interlayer insulator 258 is an insulator containing an organic material or a material having a skeletal structure including links between silicon and oxygen among multiple insulators on the substrate 200. More specifically, the interlayer insulator 258 is a single-layer or multi-layer insulator on a gate insulating film included in a thin-film transistor. In many cases, the insulator has an opening, and a conductor filled in the opening functions as a wire for connecting the upper layer pattern and the lower layer pattern. Therefore, the interlayer insulator 258 corresponds to an insulator, which is thicker and, more specifically, is 50 nm to 5 μm (more preferably, 100 nm to 2 μm) thick.

The barrier body 260 contains an insulating material or conductive material preventing the invasion of a substance facilitating the deterioration of the light emitters, and, more specifically, contains a material preventing the invasion of water and/or oxygen of epoxy resin and/or conductors.

The display device of the invention is characterized by positions of the sealing material 255 and the interlayer insulator 258. More specifically, the display device of the invention is characterized in that the interlayer insulator 258 is only provided within the display section 251 and at the intersections of the run wires 256 and 257 and wires and that the sealing material 255 is provided on the rim of the interlayer insulator 258 excluding the part above the signal line drive circuit 254. The display device of the invention is most characterized in that ends of the interlayer insulator 258 exposed on the signal line drive circuit 254 are covered by the barrier body 260, which is formed by droplet discharge technique. The intersections of the run wires 256 and 257 and wires include intersections of the run wire 256 and signal lines within the display section 251 and intersections of the run wires 256.

Next, a top view of the display device of the invention shown in FIG. 12 will be described. In comparison with the construction of the display device shown in FIG. 5, the display device shown in FIG. 12 further includes barrier bodies 261 and 262 and has the sealing material 255 at a different position. The run wire 256 does not include three power supply lines but corresponds to one power supply line.

The display device of the invention having the construction is characterized by positions of the sealing material 255 and the interlayer insulator 258. More specifically, the display device of the invention is characterized in that the interlayer insulator 258 is only provided within the display section 251 and at the intersections of the run wires 256 and 257 and wires and that the sealing material 255 is provided on the rim of the interlayer insulator 258 excluding the parts above the scan line drive circuits 252 and 253 and the signal line drive circuit 254. The display device of the invention is most characterized in that ends of the scan line drive circuits 252 and 253 and signal line drive circuit 254 are covered by the barrier bodies 260 to 262, which is formed by droplet discharge technique.

The invention having these features can prevent the invasion of water and/or oxygen to an insulator directly in contact with light emitters and can prevent the deterioration of the light emitters since the sealing material 255 is provided on the rim of the interlayer insulator 258 excluding the parts above the drive circuits and the exposed part of the interlayer insulator 258 on the signal line drive circuit 254 is covered by the barrier body, which is formed by droplet discharge technique. Therefore, the occurrence of dark spots and shrinks can be prevented, and a display device with improved reliability as a product can be provided. Furthermore, a display device having a narrow bezel can be provided since the sealing material 255 is provided on the drive circuits.

Figure 12:
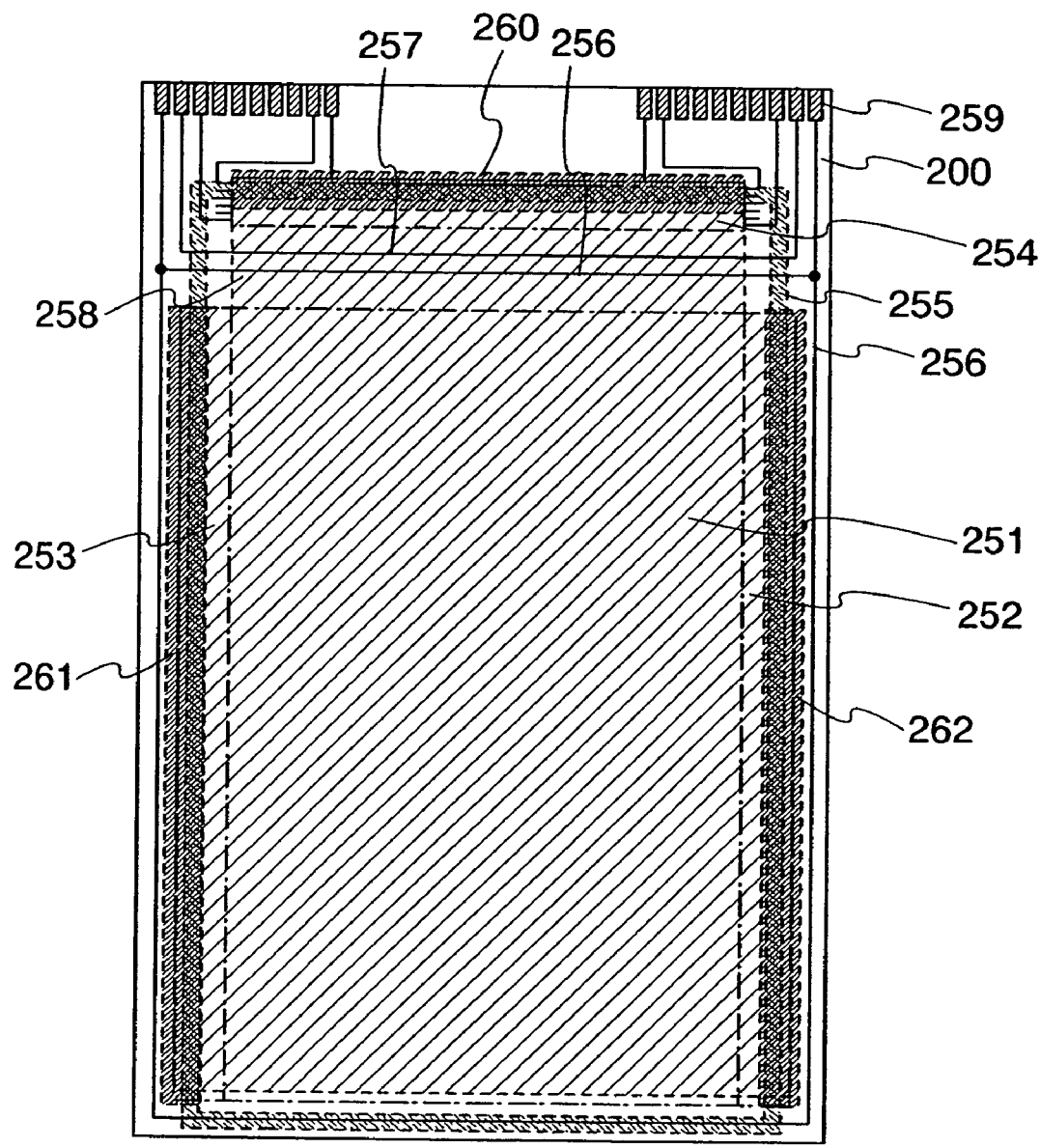
FIG. 12 shows a display device of the present invention (Embodiment Mode 1).

While FIGS. 5 and 12 show the display device integrally including the display section 251, the scan line drive circuits 252 and 253 and the signal line drive circuit 254 on the substrate 200, the display device may integrally include the scan line drive circuits 252 and 253 only as required for some applications of the display device. In this case, as the signal line drive circuit 254, a driver IC may be implemented by COG method. Alternatively, all drive circuits may be replaced by driver ICs. In other words, when the signal line drive circuit 254 is not provided, the sealing material 255 is provided on the display section 251, which further reduce the size of the bezel.

Figure 6A:
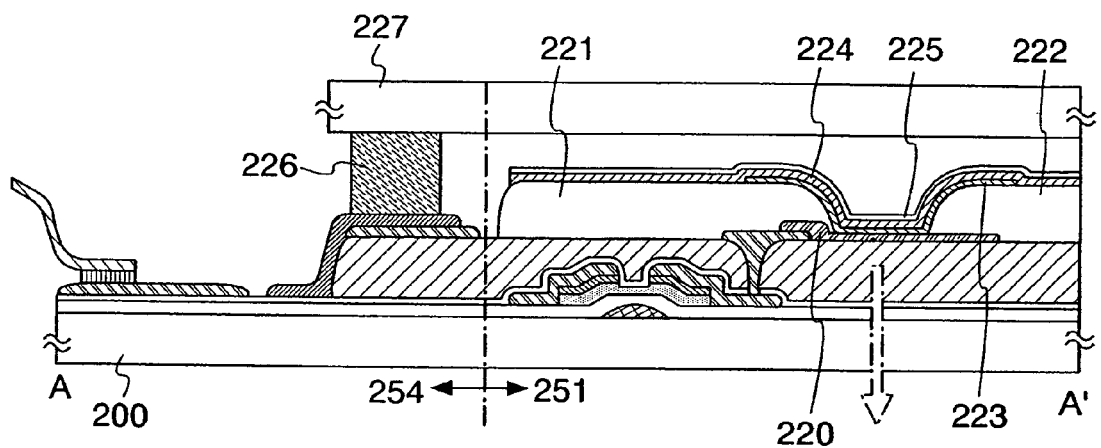
FIGS. 6A and 6B show a display device of the present invention (Embodiment Mode 2)
Figure 6B:
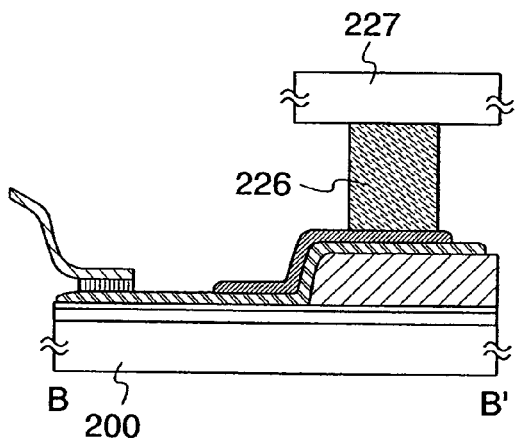

FIG. 6A is a section diagram taken at the line A-A' in FIG. 5 and is a section diagram of the connecting terminal 259, the display section 251 and the signal line drive circuit 254. FIG. 6B is a section diagram taken at the line B-B' in FIG. 5 and is a section diagram of an end of the connecting terminal 259 and the signal line drive circuit 254. The sectional structure in FIG. 6A will be described below with reference to FIGS. 7 and 8 in accordance with the production steps.

Figure 7A:
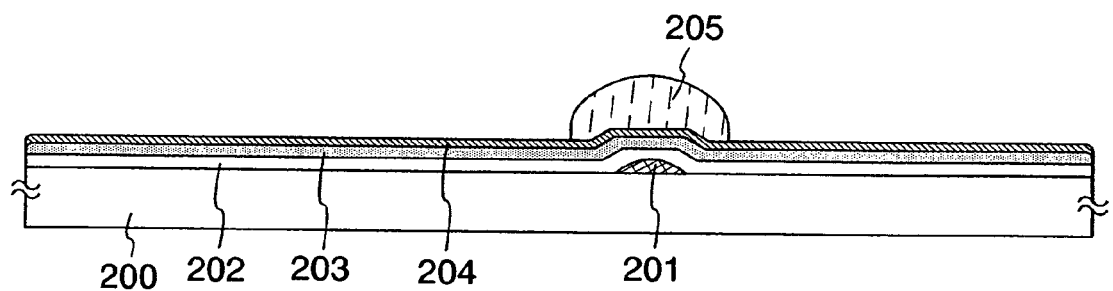
FIGS. 7A to 7C show a manufacturing method of a display device of the present invention (Embodiment Mode 2)

The substrate 200 may be a glass substrate, a quartz substrate, a metal substrate, a stainless substrate or a plastic substrate with resistance to processing temperatures of the production steps (FIG. 7A). A base film containing an insulator is formed on the substrate 200 as required. Next, a conductor 201 is formed on the substrate 200 by discharging a composition containing a conductive material by droplet discharge technique. The conductor 201 functions as a gate electrode.

Next, an insulator 202 containing a silicon oxide film or a silicon nitride film is formed by a publicly known method. The insulator 202 functions as a gate insulating film.

Subsequently, a semiconductor 203 is formed on the insulator 202 by a publicly known method. Here, the semiconductor 203 is an amorphous semiconductor. Next, an N-type semiconductor 204 is formed on the semiconductor 203 by a publicly known method. Here, the N-type semiconductor 204 is a semiconductor containing a one-conductive-type impurity. The N-type semiconductor 204 may be formed by a doping method in which an impunity element is added to an amorphous semiconductor or by using silane gas and phosphine gas. Next, a mask 205 is formed as a resist. When the mask 205 is formed by droplet discharge technique, the steps of exposing and developing can be omitted, and the use efficiency of the material can be improved.

Figure 7B:
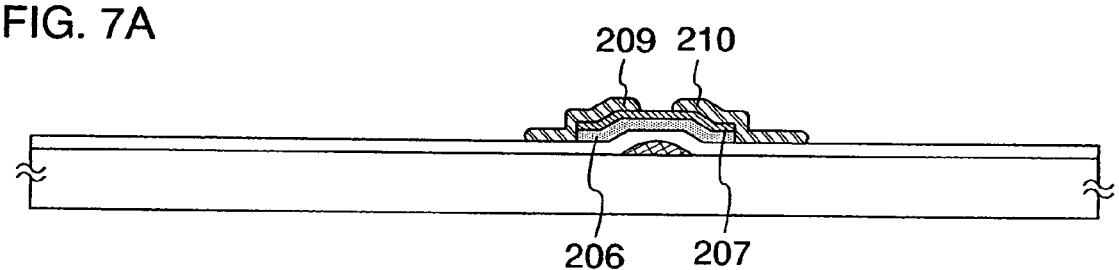

A semiconductor 206 and an N-type semiconductor 207 are formed by patterning the semiconductor 203 and the N-type semiconductor 204 through the mask 205 at the same time (FIG. 7B). Next, conductors 209 and 210 are formed by discharging a composition containing a conductive material by droplet discharge technique.

Figure 7C:
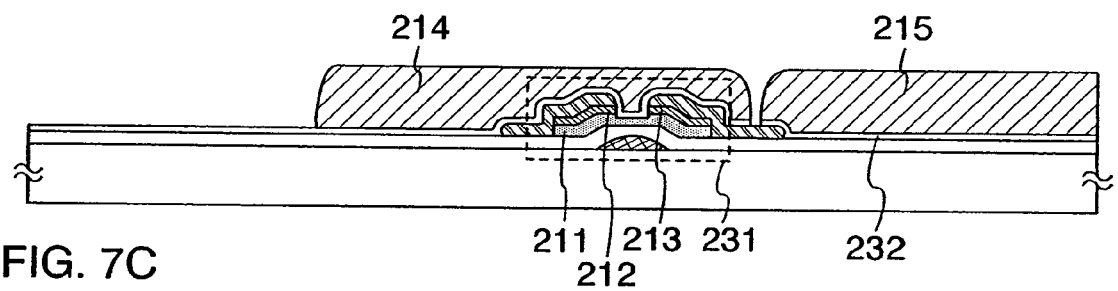

Subsequently, a semiconductor 211 and N-type semiconductors 212 and 213 are formed by patterning the semiconductor 206 and the N-type semiconductor 207 through the conductors 209 and 210 as masks at the same time (FIG. 7C). Thus, a transistor 231 including the conductor 201, the insulator 202, the semiconductor 206 and the N-type semiconductor 207 is completed.

The completed transistor 231 includes amorphous semiconductors. When the a-Si TFT is used as a transistor for driving a light emitter, the channel width W/channel length L is preferably defined to be 1 to 100 (more preferably 5 to 20) in order to improve the current ability. More specifically, the channel length L is preferably defined to be 5 to 15 μm, and the channel width W is preferably defined to 20 to 1200 m (more preferably, 40 to 600 μm). When the channel width W and the channel length L are defined as described above, the transistor takes up a large amount of pixel space. Therefore, a light emitter preferably performs upper side emission for emitting in the opposite direction of the substrate.

Next, an insulator 232 is formed entirely. The insulator 232 has a function of protecting a channel-forming region included in the transistor 231.

Next, interlayer insulators 214 and 215 are formed on the insulator 232 by forming an insulator 50 nm to 5 μm thick (more preferably 100 nm to 2 μm) all over the insulator 232 by a publicly known method and patterning the insulator into a desired form through a mask.

The interlayer insulators 214 and 215 are preferably formed by droplet discharge technique. This is because the use efficiency of a material is more significantly increased than that of a publicly known method (especially, spin-coating). Furthermore, when a composition is discharged only to a desired position by droplet discharge technique, the steps of exposing and developing can be omitted. Thus, the yield can be significantly increased. However, in this case, before a conductor connecting to the conductor 210 is newly formed, the insulator 232 must be patterned in a latter step.

Each of the interlayer insulators 214 and 215 is preferably a single layer or multi-layer of a material containing silicon such as a silicon oxide film, an organic material such as acrylic and transparent polyimide, and a compound material made by the polymerization of siloxane polymers.

A siloxane polymer is a typical example of a material including a skeletal structure including links between silicon and oxygen and containing at least hydrogen in a substituent or a material having at least one of fluorine, alkyl groups and aromatic hydrocarbons in the substituent. However, various materials under the conditions can be used instead.

An organic material and a material having a skeletal structure including links between silicon and oxygen are preferable since an organic material and a material having a skeletal structure including links between silicon and oxygen are highly flat, which can prevent the extreme reduction in thickness and/or the occurrence of a break at any level changes even though a conductor is formed thereon later. A material having a skeletal structure including links between silicon and oxygen has also transparency and thermal resistance. Thus, heating processing at a temperature of about 300 degrees can be performed after the film is formed. The heating processing allows both of the hydrogenation process and the firing process to be performed at the same time.

Next, second conductors 208, 216 and 217 are formed so as to be in contact with the insulator 210 by discharging a composition including a conductive material by droplet discharge technique. In this case, the second conductors 208, 216 and 217 function as run wires or source wires and drain wires (FIG. 8A).

Figure 8A:
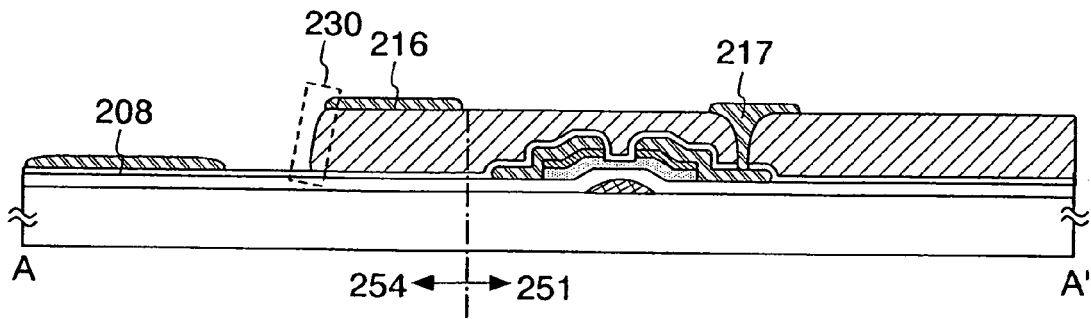
FIGS. 8A to 8C show a manufacturing method of a display device of the present invention (Embodiment Mode 2)
Figure 8B:
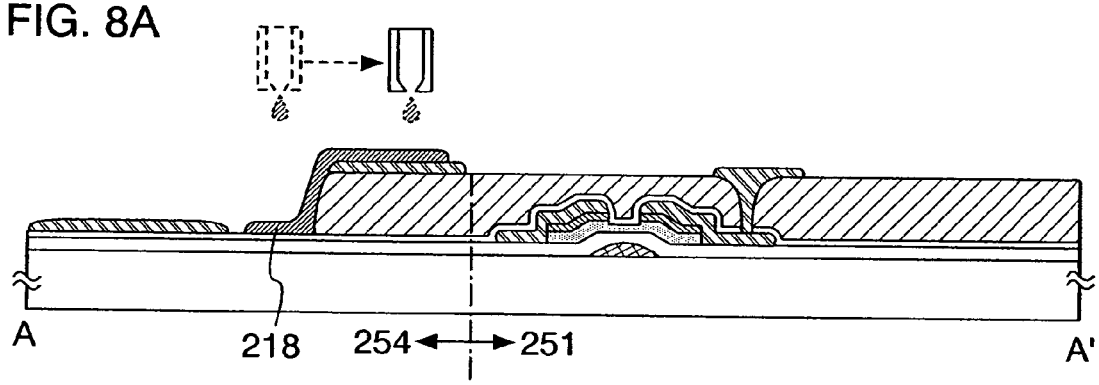

Here, as shown in FIG. 8A, an end portion 230 of the interlayer insulator 214 is exposed. However, water and/or oxygen may invade from the exposed end portion 230, and the light emitter may be deteriorated by the invading substance. Accordingly, a barrier body 218 is formed by discharging a composition by droplet discharge technique for the exposed end portion 230 (FIG. 8B). The composition used here may be a composition, which can prevent the invasion of water and/or oxygen and has the viscosity of 50 cp or lower, which can be formed by droplet discharge technique. One having these characteristics may be, for example, a publicly known conductive material or a resin material such as an epoxy resin, an acrylic resin, a phenol resin, a novolac resin, a meramine resin and an urethane resin. When one of these resin materials is used, the viscosity may be adjusted melting or dispersing using a solvent. A water-repellent resin is preferred and may be a resin containing fluorine atoms or a resin containing hydrocarbon only. More specifically, a resin containing monomers containing fluorine atoms in the molecules or a resin containing monomers including all carbon and hydrogen atoms is preferred. When the barrier body 218 is formed by a conductive material, a pattern must be formed so as to prevent a short between the barrier body 218 and wires. Therefore, the barrier body 218 containing a resin material is preferably provided in an area, which may cause a short with wires. When the barrier body 218 is formed, a break may occur with the end portion 230 at some angles. Therefore, the end portion 230 must be formed so as to have a gentle tilting surface and, more specifically, may be formed in a tapered form with 30 to 70 degrees. Furthermore, in order to prevent the break, processing of discharging one or multiple drops from the composition and firing and hardening the composition may be repeated.

Figure 8C:
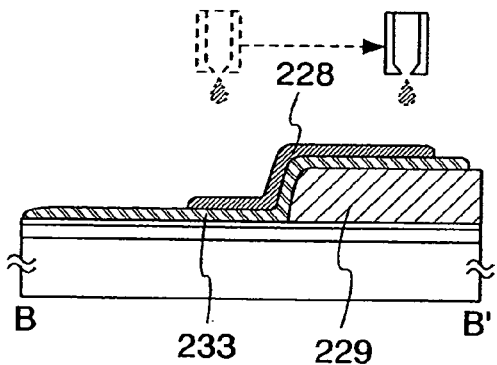

FIG. 8C is a section diagram taken at the line B-B' in FIG. 5. As shown in FIG. 8C, the interlayer insulator 229 is covered by the conductor 233 in the area including the line B-B'. Thus, the external invasion of water and/or oxygen can be prevented to some extent. However, in order to securely prevent the external invasion of an impurity, a barrier body 228 is preferably formed.

Next, a conductor (pixel electrode) 220 is formed so as to be in contact with the conductor 217 by droplet discharge technique (FIG. 6A). In this case, the conductor 220 functions as a first electrode (pixel electrode). Next, insulators 221 and 222 functioning as banks are formed by a publicly known method, and an electric field light-emitting layer 223 is formed in contact with the conductor 220. Then, a conductor 224 is stacked in contact with the electric field light emitting layer 223. Thus, a light emitter is completed including the conductor 220, the electric field light emitting layer 223 and the conductor 224. Finally, an insulator 225 is entirely formed which functions as a protective film.

Next, a sealing material 226 is formed by screen printing or dispenser method, and the substrate 200 and the opposed substrate 227 are pasted through the sealing material 226. Through these steps, a display device having light emitters is completed as shown in FIGS. 6A and 6B.

While the barrier body 218 is formed before sealing with a sealing material, the invention is not limited thereto. The barrier body 218 may be formed after sealing. In this case, the barrier body 218 may cover the opposed substrate 227 instead of being formed on the display section 251.

According to the invention having the production method, all conductive patterns of the conductors 201, 208 to 210, 216, 217 and 220 are formed by droplet discharge technique.

Therefore, these features can provide following advantages. First of all, a thin film entirely containing a conductive material is formed, and pattern processing is performed thereon. Thus, wires may be shorted due to the conductive material remaining in the side or end of a contact hole (opening). The invention using droplet discharge technique can prevent the occurrence of the short.

The section structure shown in FIGS. 6A and 6B includes the conductor 220 on the same layer as the layer having the conductors 216 and 217. In this case, the conductor 220 functions as a pixel electrode. However, in order to improve an aperture ratio for emitting light from the light emitters in the opposite direction of the substrate 200, that is, for so-called upper side emission as shown in FIG. 4, another insulator layer may be additionally formed on the conductors 216 and 217. Then, a conductor functioning as a pixel electrode may be formed on the insulator. In the display device having the construction, the area having the conductor 134 functioning as a pixel electrode can be increased. Thus, the aperture ratio can be improved.

This embodiment can be freely combined with the first embodiment.

Embodiment 1

Figure 9A:
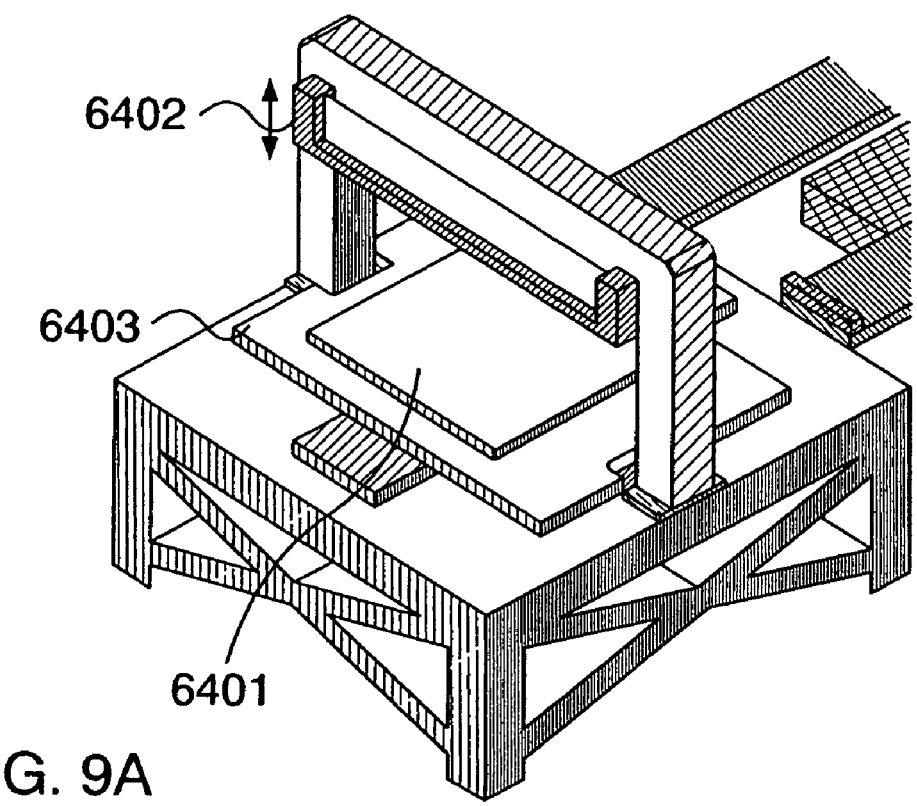
FIGS. 9A and 9B show a droplet discharging apparatus applied to a manufacturing method of a display device of the present invention (Embodiment 1)

An example of a droplet discharging apparatus to be used for producing wires and semiconductors according to the invention will be described with reference to FIGS. 9A and 9B. First of all, a construction of the droplet discharging apparatus will be briefly described with reference to FIG. 9A. The droplet discharging apparatus must include a droplet discharging unit (not shown) including one nozzle or a droplet discharging unit (not shown) including a head having multiple nozzles arranged in one axial direction, a controller and CPU (not shown) for controlling the droplet discharging unit, and a stage 6403 fixing the substrate 6401 and being movable in an XYθ direction. In order to improve cycle time, the droplet discharging unit including a head having multiple nozzles arranged in one axial direction is preferably used.

Figure 9B:
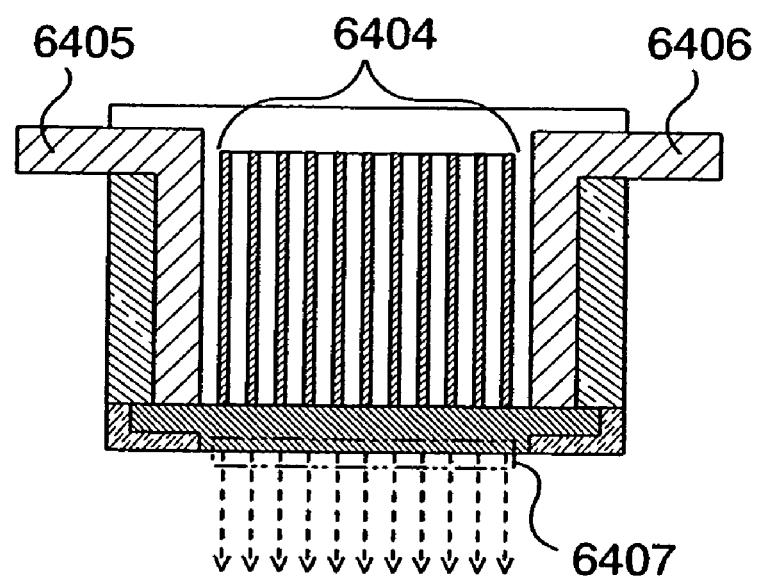

The droplet discharging unit is provided on a frame 6402, and the frame 6402 has a structure for fitting the droplet discharging unit shown in FIG. 9B. The stage 6403 has a function of fixing the substrate 6401 by a technique such as vacuum chuck. A composition is discharged from outlets of the nozzles of the droplet discharging unit toward the substrate 6401, and a pattern is formed thereby.

The stage 6403 and the droplet discharging unit are controlled by the CPU through the controller. An image pickup unit (not shown) such as a CCD camera is also controlled by the CPU. The image pickup unit detects a position of a marker and supplies the detected information to the CPU. In producing the pattern, the droplet discharging unit may be moved, or the droplet discharging unit may be fixed and the stage 6403 may be moved. In this case, the droplet discharging unit must be moved in consideration of an acceleration of a composition, a distance between nozzles of the droplet discharging unit and a subject and the environment.

In order to improve the hit accuracy of a discharged composition, a moving mechanism for moving the droplet discharging unit upward and downward and a control unit therefor (not shown) may be further provided as optional components. Thus, the distance between the head and the substrate 6401 can be changed in accordance with a characteristic of a discharged composition. Furthermore, a cleaning unit may be provided for supplying clean air and reducing dusts in a work area. Furthermore, a unit (not shown) for heating substrate and a unit (not shown) for measuring various physical properties such as temperatures and pressures may be provided as required. These units can be centrally and externally controlled by a control unit provided outside of a cabinet thereof. The control unit connecting to a production management system through a LAN cable, a wireless LAN, an optical fiber or the like can centrally manage the steps. Thus, the productivity can be improved. In order to increase the speed of drying a bit composition and to remove a solvent component of the composition, the air may be exhausted in a vacuum to a lower pressure.

FIG. 9B shows the droplet discharging unit. The droplet discharging unit includes a piezoelectric element 6404 and frames 6405 and 6406 to be used to fit into the frame 6402 shown in FIG. 9A. The droplet discharging unit further includes an outlet 6407. In FIG. 9B, the piezoelectric element is shown, but, for some solvent materials, a heating element may be heated, bubbles may be caused, and the solvent may be pressed out. In this case, the piezoelectric element is replaced by a heater. Furthermore, in order to discharge droplets, adjusting the wettability is important between a solvent and a fluid reservoir duct, an auxiliary fluid reservoir, a fluid resistance section, a pressurizer and a solvent outlet. Therefore, a carbon film, a resin film or the like may be provided in the ducts for adjusting the wettability with a given material. Wires, supply tubes and so on are provided within the frames 6405 and 6406. When the droplet discharging unit in FIG. 9B is mounted in the apparatus shown in FIG. 9A, the wires are connected to a drive circuit for controlling the piezoelectric element. The supply tube is connected to a tank filled with a composition.

Embodiment 2

The invention can be applied to various electronic apparatuses such as a video camera, a digital camera, a goggle type display, a navigation system, an audio reproducing device such as a car audio system, a notebook personal computer, a game machine, a portable information terminal (a mobile computer, a mobile phone, a portable game machine, an electronic book and the like), an image reproducing device provided with a recording medium, such as a home video game machine (specifically, a device which is capable of reproducing a recording medium such as a DVD and has a display for displaying the reproduced image). The specific examples of such electronic apparatuses are shown in FIGS. 10A to 11C.

FIG. 10A shows a portable terminal which includes a main body 9101, a display section 9102, and so forth. FIG. 10B shows a panel provided in the portable terminal. The panel has the display section 9102 and a driver circuit 9103 on the same substrate. FIG. 10C shows a PDA which includes a main body 9201, a display section 9202, and so forth. FIG. 10D shows a portable game machine which includes a main body 9401, a display section 9402, and so forth. FIG. 10E shows a digital video camera which includes a main body 9701, a display section 9702, and so forth.

In the aforementioned electronic apparatuses, the display device of the invention can be applied to a panel including the display sections 9102, 9202, 9402, 9701 and 9702. Each of these panels including display sections has a pair of substrates mated with each other, and the invention is applied to the panel and the method of manufacturing thereof.

FIG. 11A shows a television which includes a chassis 9501, a display section 9502, and so forth. FIG. 11B shows a monitor attached to a personal computer, which includes a chassis 9601, a display section 9602, and so forth. FIG. 11C shows a notebook personal computer which includes a chassis 9801, a display section 9802, and so forth.

The invention is applicable to the production of panels including the display sections 9502, 9602 and 9802. From price and/or process points of view, like electronic equipment shown in FIGS. 11A to 11C and like the second embodiment, the 10 inch or larger panels including the display sections 9502, 9602 and 9802 are preferably include thin film transistors (a-Si TFI) having channel sections containing amorphous semiconductors. The use of amorphous semiconductors can provide low-price electronic equipment since the crystallization step can be omitted from the production process.

The application of a display device of the invention, which prevents dark spots and shrinks and improves the reliability as a product, can provide electronic equipment having longer lives. The invention providing a method of producing a display device simplified by the application of droplet discharge technique can provide low-price electronic equipment.

In mobile terminals shown FIGS. 10A to 10E among those electronic equipment, self-luminous light emitters are preferably used as display devices in the display sections. The light emitters can be thinner, smaller and lighter than liquid crystals because backlights are not required, for example. Furthermore, as shown in FIGS. 11A to 11C, the thickness, size and weight of 10 inch or larger electronic equipment can be reduced by using light emitters. Especially, as shown in FIG. 11A, the weight and size of a 40-inch or larger television can be significantly improved in comparison with a CRT television.

The invention claimed is:

1. A display device comprising:
    a display section comprising a thin film transistor and a luminous element over a first substrate;
    a first interlayer insulator formed between the thin film transistor and the luminous element, wherein the first interlayer insulator comprises a resin material;
    a barrier body covering an end portion of the first interlayer insulator, the barrier body comprising a conductive material;
    a protective film formed over the luminous element, the protective film comprising an insulating material;
    a second substrate opposed to the first substrate; and
    a sealing material interposed between the first substrate and the second substrate,
    wherein the sealing material is in direct contact with the barrier body,
    wherein the barrier body is interposed between the sealing material and the first interlayer insulator,
    wherein the sealing material is in direct contact with the barrier body at a portion, and
    wherein the portion is overlapped with the first interlayer insulator.

2. A display device comprising:
    a display section comprising a luminous element and a thin film transistor formed over a first substrate;
    a driver circuit over the first substrate;
    a first interlayer insulator formed between the thin film transistor and the luminous element, wherein the first interlayer insulator comprises a resin material;
    a run wire formed over the first interlayer insulator and disposed outside the display section;
    a barrier body covering the run wire and an end portion of the first interlayer insulator, the barrier body comprising a conductive material;
    a protective film formed over the luminous element, the protective film comprising an insulating material;
    a second substrate opposed to the first substrate; and
    a sealing material interposed between the first substrate and the second substrate,
    wherein the sealing material is in direct contact with the barrier body.

3. An electronic apparatus comprising the display device according to any one of claims 1 and 2,
    wherein the electronic apparatus is selected from the group consisting of a video camera, a digital camera, a goggle type display, a navigation system, an audio reproducing device, a notebook personal computer, a television, a game machine, a mobile computer, a mobile phone, a portable game machine, an electronic book, and an image reproducing device.

4. The display device according to claim 1, wherein the resin material is a siloxane polymer.

5. The display device according to claim 2, wherein the resin material is a siloxane polymer.

6. The display device according to claim 1, wherein the barrier body and the protective film are separated from each other.

7. The display device according to claim 2, wherein the barrier body and the protective film are separated from each other.

8. The display device according to claim 2, wherein the barrier body and the run wire are in direct contact with each other.

9. The display device according to claim 1, wherein the barrier body covers a side surface of the first interlayer insulator.

10. The display device according to claim 2, wherein the barrier body covers a side surface of the first interlayer insulator.

* * * * *